US011601216B1

(12) United States Patent
Gunn et al.

(10) Patent No.: US 11,601,216 B1
(45) Date of Patent: Mar. 7, 2023

(54) ALIGNMENT DETECTION BY FULL AND PARTIAL FEC DECODING

(71) Applicant: L3Harris Technologies, Inc., Melbourne, FL (US)

(72) Inventors: Joshua D. Gunn, Farmington, UT (US); Ryan W. Hinton, Erda, UT (US); Edwin J. Hemphill, Kaysville, UT (US)

(73) Assignee: L3HARRIS TECHNOLOGIES, INC., Melbourne, FL (US)

( * ) Notice: Subject to any disclaimer, the term of this patent is extended or adjusted under 35 U.S.C. 154(b) by 0 days.

(21) Appl. No.: 17/538,618

(22) Filed: Nov. 30, 2021

(51) Int. Cl.
*H04L 1/18* (2006.01)
*H04L 1/00* (2006.01)

(52) U.S. Cl.
CPC ............................. *H04L 1/0016* (2013.01)

(58) Field of Classification Search
None
See application file for complete search history.

(56) References Cited

U.S. PATENT DOCUMENTS

| 6,081,570 | A | * | 6/2000 | Ghuman | H04J 3/0605 370/514 |
|---|---|---|---|---|---|
| 7,065,696 | B1 | * | 6/2006 | Liu | H04L 1/0065 714/775 |
| 2004/0207763 | A1 | * | 10/2004 | Ciardi | H04N 9/45 725/138 |
| 2012/0269205 | A1 | * | 10/2012 | Haque | H04L 7/08 370/509 |
| 2017/0347340 | A1 | * | 11/2017 | Haley | H04L 27/2657 |

* cited by examiner

Primary Examiner — Mujtaba M Chaudry
(74) Attorney, Agent, or Firm — Workman Nydegger

(57) ABSTRACT

A forward error correction (FEC) decoder is configured to find an alignment of a code block in a data stream by attempting to fully or partially decode one or more data windows of a predetermined size in the data stream. The predetermined size is a size of each codeword. The FEC decoder selects a first data window of the predetermined size, attempts to decode the first data window based on a particular error control coding method, and determines whether a valid codeword can be identified by attempting to decode the first data window. In response to determining that a valid codeword can be identified, the FEC decoder determines that an alignment of the codeword with the first data window is found. Otherwise, the FEC decoder selects a second data window of the predetermined size and attempts to decode the second data window.

20 Claims, 8 Drawing Sheets

ALIGNMENT DETECTION BY FULL AND PARTIAL FEC DECODING

BACKGROUND

In some digital communication systems, data is encoded into codewords via a particular error control coding method. In some cases, the codewords are then divided into fixed-sized frames. As the propagation channel does not have a concept of frames or separated data units, the sender and receiver have to recognize frame borders in the data stream. This process of recognizing the borders of each data frame is called frame synchronization.

In conventional frame synchronization schemes, syncwords are inserted into the modulated symbol streams. In particular, a syncword (also referred to as a sync sequence) is inserted between two frames of codewords, each of which has a predetermined number of codewords. The receiver has a synchronizer (which is often a special circuit) configured to detect these known syncwords, and their positions are used to identify the beginning and end of a frame of codewords.

In general, a synchronizer operates in two basic modes, namely, an acquisition mode and a lock mode. In the acquisition mode, the synchronizer searches the syncword to establish synchronization. Once the synchronization is achieved, the synchronizer enters the lock mode and passes data frames to the next stage with syncwords stripped off. In the lock mode, the syncwords are usually detected or confirmed at the predicted positions.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

This Summary is provided to introduce a selection of concepts in a simplified form that is further described below in the Detailed Description. This Summary is not intended to identify key features or essential features of the claimed subject matter, nor is it intended to be used as an aid in determining the scope of the claimed subject matter.

The embodiments described herein are related to a wireless digital communication system, a method, and/or a receiver for detecting borders of codewords or data frames in a data stream by full and partial forward error correction (FEC) decoding. The process of finding borders of codewords or data frames in the data stream is also referred to as alignment.

The wireless digital communication system includes a receiver configured to receive a data stream containing multiple code blocks. Each code block has a predetermined size and was encoded based on a particular error control coding method, such as (but not limited to) a turbo coding method, a low-density parity-check decoding (LDPC) method, or other block coding method. The receiver includes a FEC decoder.

The FEC decoder has an acquisition mode and a lock mode. When the FEC decoder is in the lock mode, the decoder knows the borders of each code block in the data stream, and the decoder is configured to decode each code block in the data stream based on the particular error control coding method.

When the FEC decoder is in the acquisition mode, the FEC decoder does not know the boarders of each code block, and the FEC decoder is configured to find an alignment of a code block by attempting to fully decode or partially decode one or more data windows of the predetermined size in the data stream. In particular, the FEC decoder selects a first data point in the data stream, and fully decodes or partially decodes a data window of the predetermined size starting from the first data point based on the particular error control coding method. The FEC decoder then determines whether the fully decoded or partially decoded data window is a valid codeword. In response to determining that the fully decoded or partially decoded data window is a valid codeword, an alignment of a code block with the data window is found, and the FEC decoder is switched to the lock mode.

In response to determining that the decoded data window is not a valid codeword, the FEC decoder selects a second data point in the data stream and fully decodes or partially decodes a data window of the predetermined size starting from the second data point based on the particular error control coding method. This process repeats until an alignment of a code block with the data window is found.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments that are illustrated in the appended drawings. Understanding that these drawings depict only typical embodiments and are not, therefore, to be considered to be limiting in scope, embodiments will be described and explained with additional specificity and details through the use of the accompanying drawings in which.

DETAILED DESCRIPTION

Figure 1:
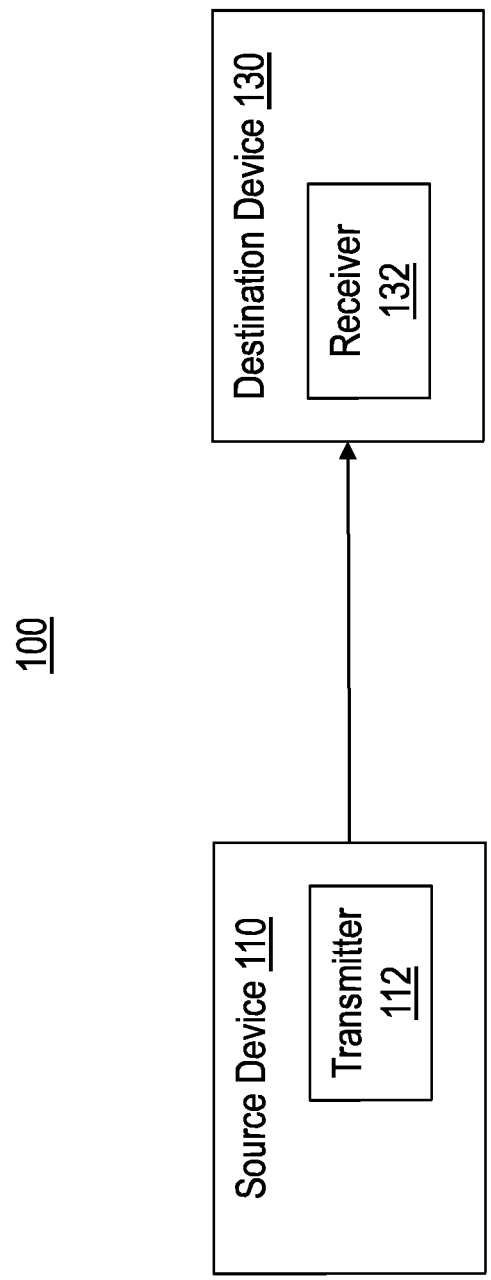
FIG. 1 illustrates an example of a wireless digital communication system.

The embodiments described herein are related to a wireless digital communication system, a method, and/or a receiver for attempting to detect borders of code blocks or data frames in a data stream by speculative forward error correction (FEC) decoding (also referred to as channel decoding). The process of finding borders of code blocks or data frames in the data stream is also referred to as alignment, synchronization, and/or acquisition.

Traditionally, alignment is obtained by watching for a synchronization sequence (also referred to as a syncword) in the data stream. Some established waveforms and waveform families have a fixed data payload between synchronization sequences. This means that as the data rate is lowered, the sync sequences come further apart in time, which can put a lower limit on average acquisition times if the receiver needs to find one or more of these sync sequences. For example, a 64 Kbps waveform with 64 Kb data payload between sync sequences would require at least 1 second for acquisition in the worst case (average ½ second). Many implementations only pass data through to the FEC decoder once the sync sequences have been identified as being found (which may require the receiver to identify several consecutive sync sequences).

The principles described herein solve the above-described problem, i.e., the problem of extended periods of time for achieving acquisition when using lower data rates, by using an existing FEC decoder (e.g., a turbo code decoder), with hardware capable of decoding at rates much faster than the lower data rate, to detect FEC alignment to accelerate acquisition in waveforms with infrequent sync patterns. Some of the modems have the capability to decode waveforms (e.g., turbo coded waveforms) at a rate on the order of 100 Mbps. Some of these same modems support waveforms of throughput 100 Kbps or less, meaning that the modems are capable of decoding data three orders of magnitude greater than the data is being received. The principles described herein include using speculative full and partial (e.g., reduced decoding iterations) decoding of multiple possible alignments to identify the FEC alignment. Speculative decoding refers to attempts to decode when the valid alignment may be unknown. Indeed in some embodiments, embodiments may use a sliding window to attempt to decode every alignment until a valid alignment is found. Alternatively, embodiments may use a sliding window with a fixed number of coded bit shifts until a valid alignment is found. Alternatively, embodiments may select random or pseudo random alignments until a valid alignment is found. This is well suited to non-interleaved waveforms where the receiver is capable of Turbo decoding at a much higher rate than the low-rate waveform of interest. The decoder would run a full or partial decoding on a particular window of bits, assumed to be an FEC code block that results from transmitting a valid codeword in the FEC code. If it happens to be in correct alignment and the channel is sufficiently good, the block will be fully decoded to a valid codeword and the internal Turbo decoder metrics will converge. Partial decoding occurs where iterations for decoding attempts are halted when it is determined that further iterations are unlikely to result in a valid alignment due to evaluation of decoding with respect to different internal metric thresholds or with metrics such as the number of bits corrected. In some embodiments, partial decoding includes performing an error correction process iteratively until a decoder metric reaches a predetermined value. In some embodiments, the decoder metric includes (but is not limited to) (1) a predetermined number of iterations being performed, (2) a predetermined number of bits being corrected, (3) numerical convergence or divergence of an internal decoding metrics, or (4) an error is detected. In some embodiments, the predetermined value of a decoder metric is determined based on processing power of the FEC decoder relative to data receiving rate of the data stream.

The probability of converging to a codeword given input that was not generated from a codeword is extremely small. At low enough data rates, this sliding window decoding can be performed for every single received bit (or symbol for modulation orders greater than 1). At higher rates, the decoder may not be able to process fast enough to do a full or partial decoding on every possible FEC block alignment, until a valid alignment is found, and some subset of the possible alignments may be performed. In this case, care should be taken that the alignment will be eventually found. For example, a code block size of 1024 bits, the window shift size of 3 bits will ensure that the alignment will be found within 3 code blocks. In some embodiments, this shift represents a relative prime fixed window shift with respect to the block size.

FIG. 1 illustrates an example of an environment of a wireless communication system 100. The wireless communication system 100 includes one or more source devices 110, and one or more destination devices 130. As illustrated, the source device 110 includes a transmitter 112 configured to send out a wireless signal having the destination device 130 as a destination. The destination device 130 includes a receiver 132 configured to receive the signal transmitted by the source device 110. In some embodiments, each of the source devices 110 and destination devices 130 may be a mobile phone, a tablet, a laptop computer, a radio, or any object that is coupled to a communication circuitry and/or device, such as (but not limited to) a ground vehicle, an airplane, a watercraft, and/or a satellite.

Figure 2:
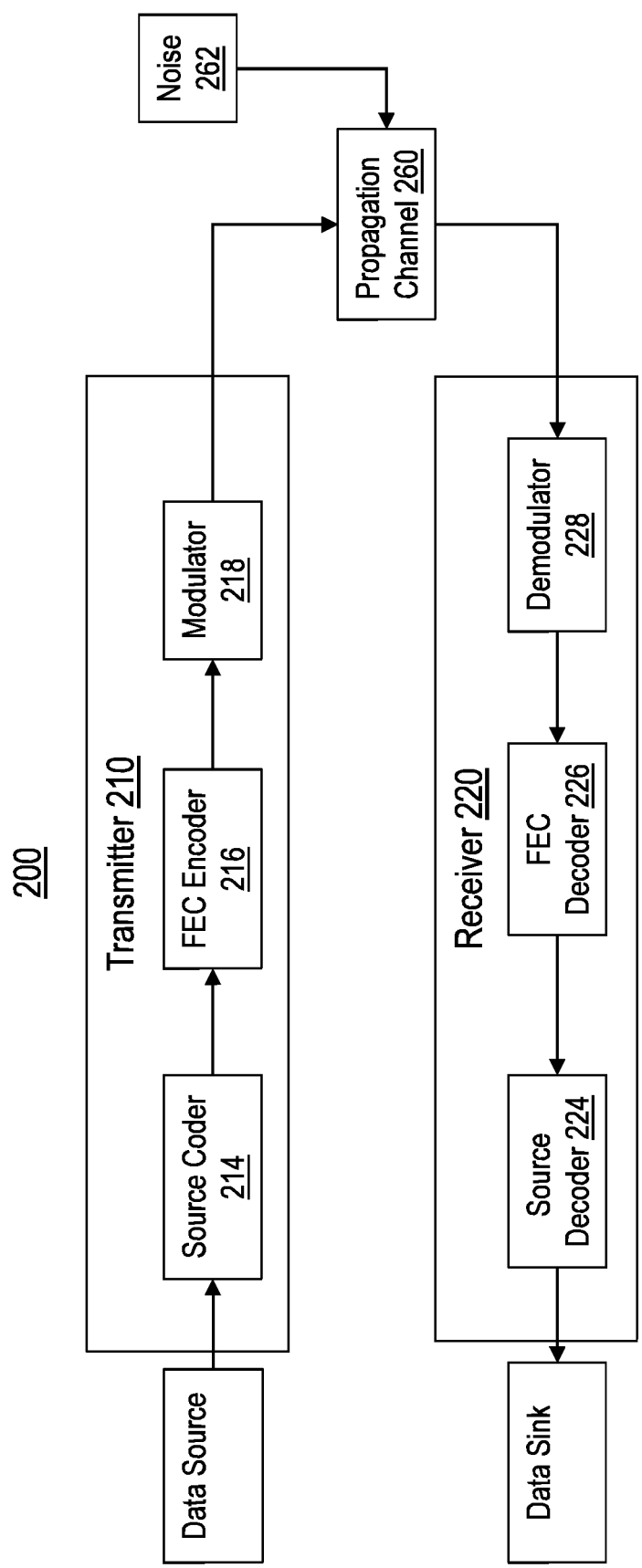
FIG. 2 illustrates an example of a communications link in a wireless digital communication system of FIG. 1.

In a wireless digital communication system, the transmitting and receiving of a signal in a link include many steps. FIG. 2 illustrates a functional block diagram of an example of a communications link 200, including a transmitter 210 and a receiver 220. The transmitter 210 includes a source coder 214, a FEC encoder 216, and a modulator 218. The FEC encoder 216 is configured to add redundancy, for example, in a form for a forward error correction code, in order to make it more resistant to transmission errors introduced by the channel 260. The receiver 220 includes a demodulator 228, a FEC decoder 226, and a source decoder 224. The FEC decoder 226 is configured to eliminate most or all of the errors (which may be caused by noise 262) that may be present in the resulting bitstream. Note, the functional blocks shown in FIG. 2 are oversimplified, and the separation of the functional blocks in embodiments are not necessarily the same as shown in FIG. 2. One or more of these functional blocks in FIG. 2 may be combined into a single electronic device, including complex circuitry, one or more generic processors and/or storages that are configured to execute custom or generic firmware and/or software to achieve the desired results.

As illustrated in FIG. 2, data can be transmitted from the transmitter 210 to the receiver 220 via the propagation channel 260. However, data in networks is not transferred as a simple stream of bits or bytes but in terms of frames or packets. As the propagation channel does not have a concept of frames or separated data units, the sender and receiver are configured to recognize frame borders in the data stream. This process of recognizing the borders of each data frame is called alignment.

In conventional alignment schemes, a synchronization sequence (also referred to as a syncword) is inserted into the modulated symbol streams. At the receiver end, this known syncword is detected, and its position is used to identify the beginning and end of coded blocks (also referred to as frames). In general, a synchronizer operates in two basic modes, namely an acquisition mode and a lock mode. In the acquisition mode, the receiver does not know the borders of each data frame. Thus, the synchronizer tries to identify the borders of at least one data frame by finding one or more syncwords. Once the one or more syncwords are found, the synchronizer enters the lock mode and passes data frames to the next stage (such as a demodulator or an FEC decoder) with the syncword stripped off. In the lock mode, the syncword has already been detected or confirmed at the predicted positions, and the receiver knows the borders of each data frame.

For example, when a receiver is turned on or restarted, it is often in the acquisition mode. The process of transitioning from the acquisition mode to the lock mode is called acquisition. One of the components of acquisition is FEC alignment (also referred to as alignment). The time required for acquisition is called an acquisition time. For various reasons, fast acquisition often becomes difficult for low data rates for a fixed physical layer framing scheme. The principles described herein solve the problem of slow acquisition for low data rates by using an FEC decoder to detect alignment at various codeword boundaries, instead of at syncword boundaries.

Figure 3:
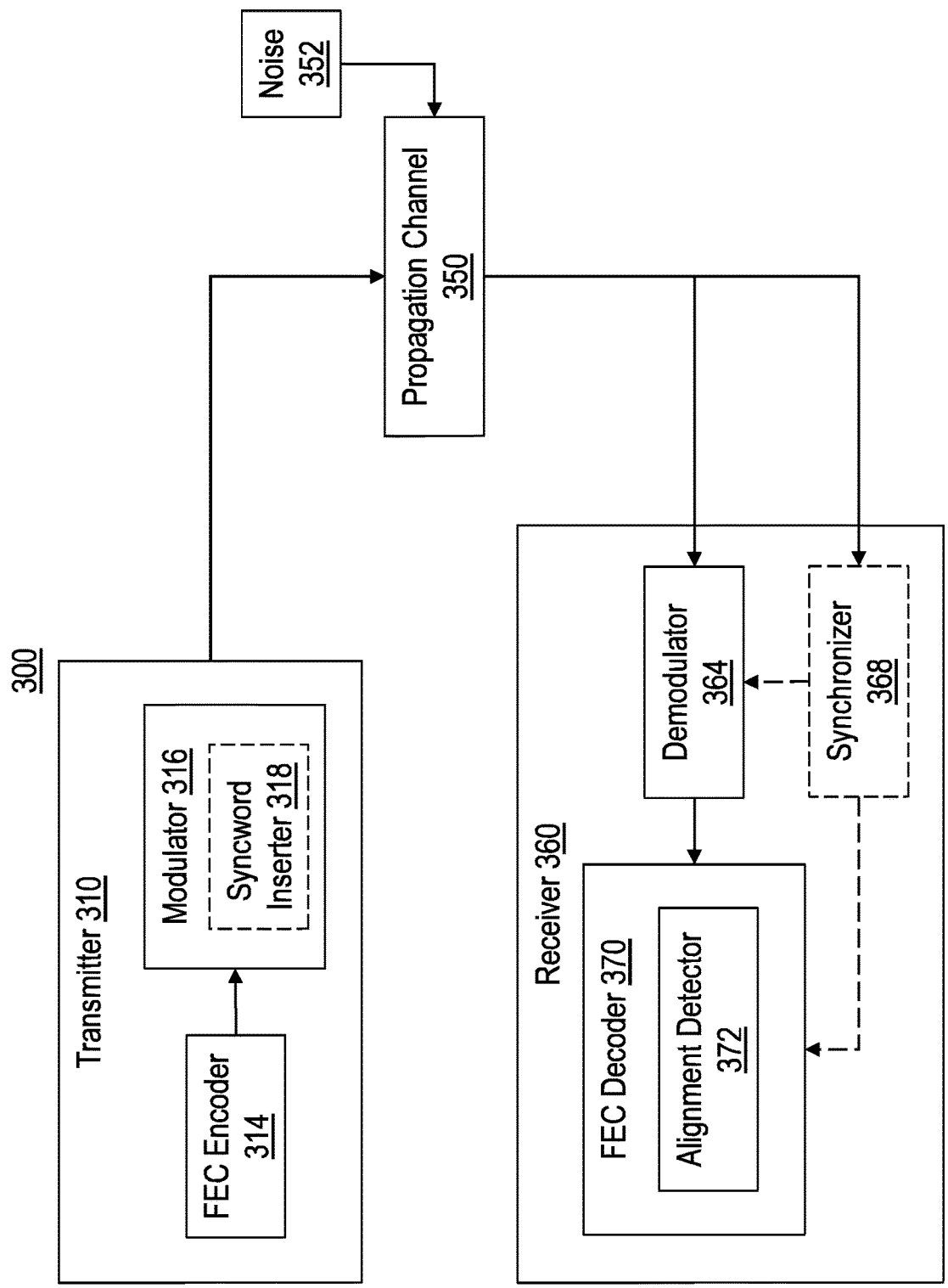
FIG. 3 illustrates an example of a communications link that implements the principles described herein.

FIG. 3 illustrates an example of a communications link 300, in which a receiver 360 implements the principles described herein. As illustrated, the link 300 includes a transmitter 310, a receiver 360, and a propagation channel 350, which corresponds respectively to the transmitter 210, the receiver 220, and the propagation channel 260 of FIG. 2. The transmitter 310 is configured to transmit data to the receiver 360 via a propagation channel 350, which introduces noise 352. The transmitter 310 includes an FEC encoder 314 and a modulator 316, which correspond respectively to the FEC encoder 216 and the modulator 218 of FIG. 2.

The receiver 360 includes a demodulator 364 and an FEC decoder 370, which corresponds respectively to the demodulator 228 and the FEC decoder 226. The demodulator 228 is configured to demodulate the received symbol streams with syncwords into a digital data stream, such as a bitstream. The digital data stream is sent to the FEC decoder 370. The FEC decoder 370 includes an alignment detector 372 configured to detect an alignment of a code block.

When the FEC decoder 370 is in the acquisition mode, the alignment detector 372 selects a data window of a predetermined number of data units (such as symbols or bits) in the data stream, and assumes the predetermined number of data units to be an FEC codeword. The data window of the predetermined number of data units (also referred to as a code block) has the same size as a codeword. The alignment detector 372 then runs full or partial decoding on the code block. If the decoded code block cannot be decoded into a valid codeword, another window of the predetermined number of data units is selected and decoded. This process repeats until a valid codeword (or even when a valid syncword) is found. When the valid codeword is found, the decoder assumes that an alignment is found, because the probability of converging to a codeword given the input was not generated from a codeword is extremely small. Accordingly, the FEC decoder 370 may achieve synchronization in a waveform in which the insertion of syncwords is not required.

Figure 4:
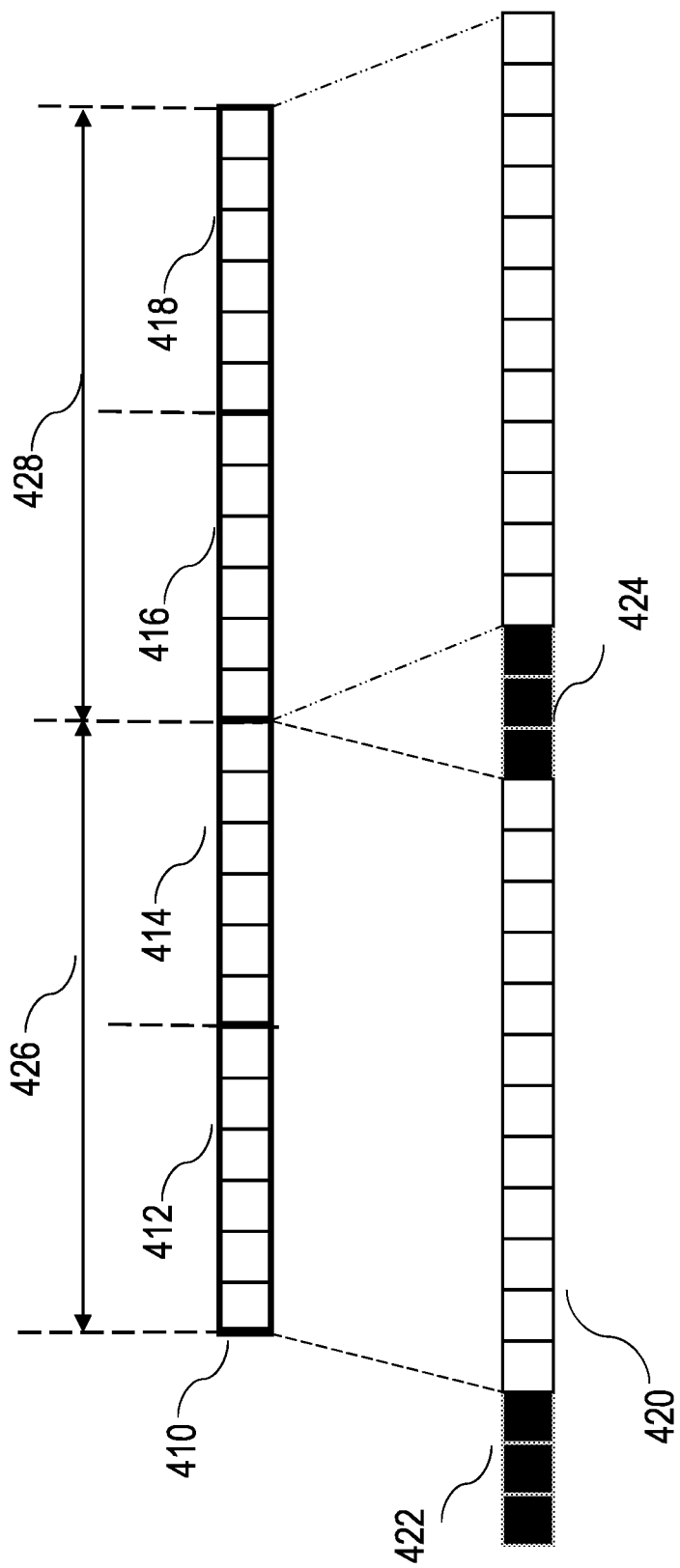
FIG. 4 illustrates an example of a process of inserting syncwords into a symbol stream.

In some embodiments, the same principles may also be implemented in the acquisition of synchronized waveforms (that include syncwords, albeit infrequently encountered) to reduce the acquisition time. In such an embodiment, the modulator 316 further includes a syncword inserter 318 configured to insert syncwords into the modulated symbols streams. The syncwords are configured to divide the symbol stream into multiple frames. FIG. 4 illustrates an example of a symbol stream 410 in which multiple syncwords 422, 424 are inserted to generate a new symbol stream 420. As illustrated, the symbol stream 410 includes multiple codewords 412, 414, 416, and 418, and the symbol stream 410 is divided into multiple frames 426, 428, each of which includes a predetermined number of codewords.

In such a case, the receiver 360 may also include a synchronizer 368 configured to detect one or more syncwords. The synchronizer 368 may or may not be a component of the demodulator 364. In embodiments, while the synchronizer 368 is configured to perform acquisition or synchronization, which identifies one or more syncwords in the symbol streams, the demodulator 364 and the FEC decoder 370 are also going through windows of data units (e.g., bits) for finding codewords.

There are many different error control coding schemes, including linear block code (e.g., low-density parity-check (LDPC) code, turbo code) or non-linear block code. Regardless of which specific coding or decoding method is implemented, the alignment detector 372 of FIG. 3 is configured to detect alignment by decoding one or more data windows.

Figure 5:
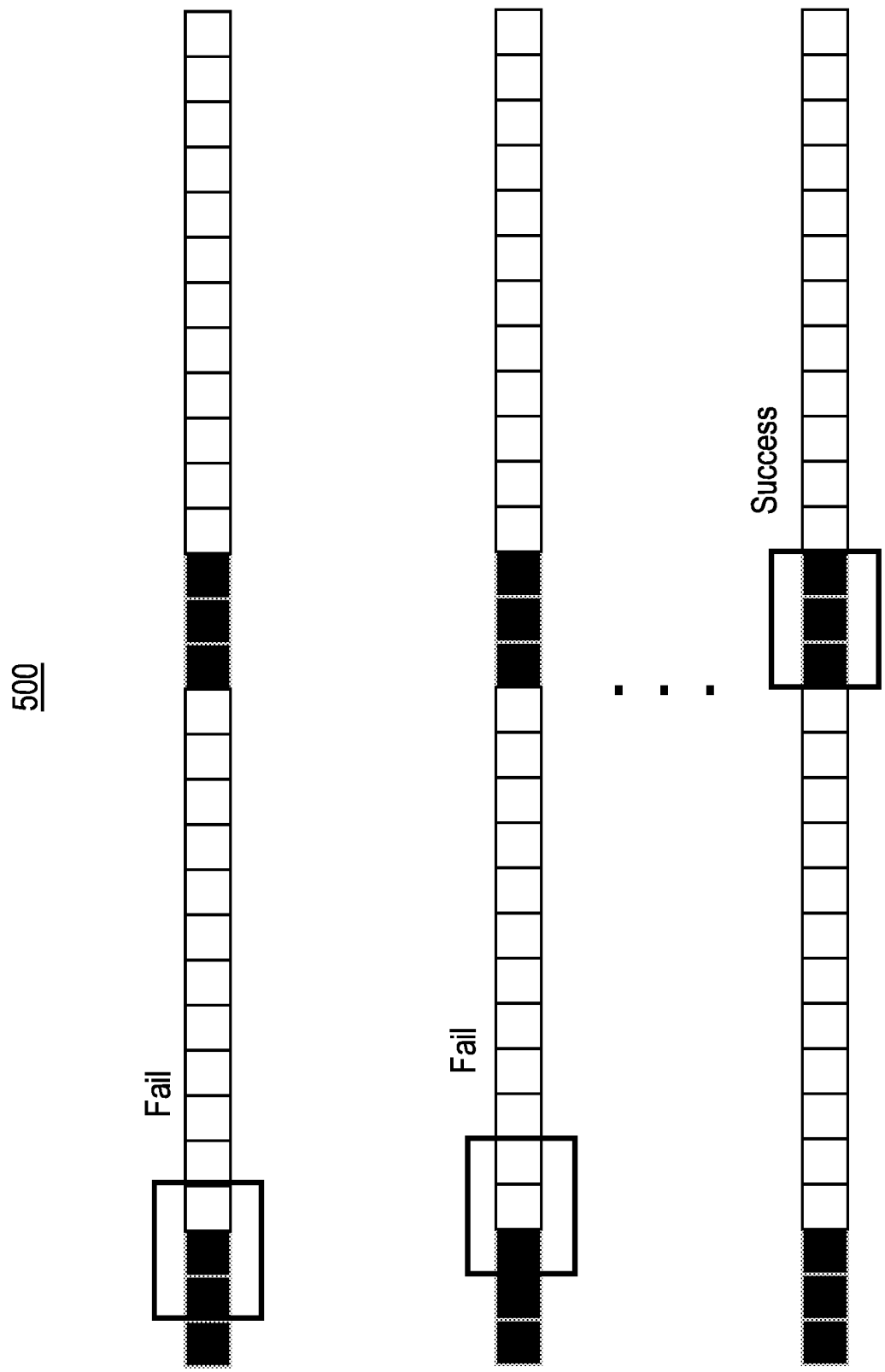
FIG. 5 illustrates an example of a process of identifying one or more syncwords in a symbol stream.

FIG. 5 illustrates a process of detecting one or more syncwords in a symbol stream by a synchronizer 368. As illustrated, the synchronizer 368 scans a symbol window of a predetermined number of symbols that corresponds to the length of each syncword. Depending on the starting point of the symbol window, the synchronizer 368 may be required to scan a whole frame of the symbol stream before a valid syncword is found. For example, a 64 Kbps waveform with 64 Kb data payload between syncwords would require at least 1 second in the worst case (or an average of 0.5 seconds) for acquisition. In a conventional receiver, a decoder will not start decoding until the acquisition is completed.

Figure 6:
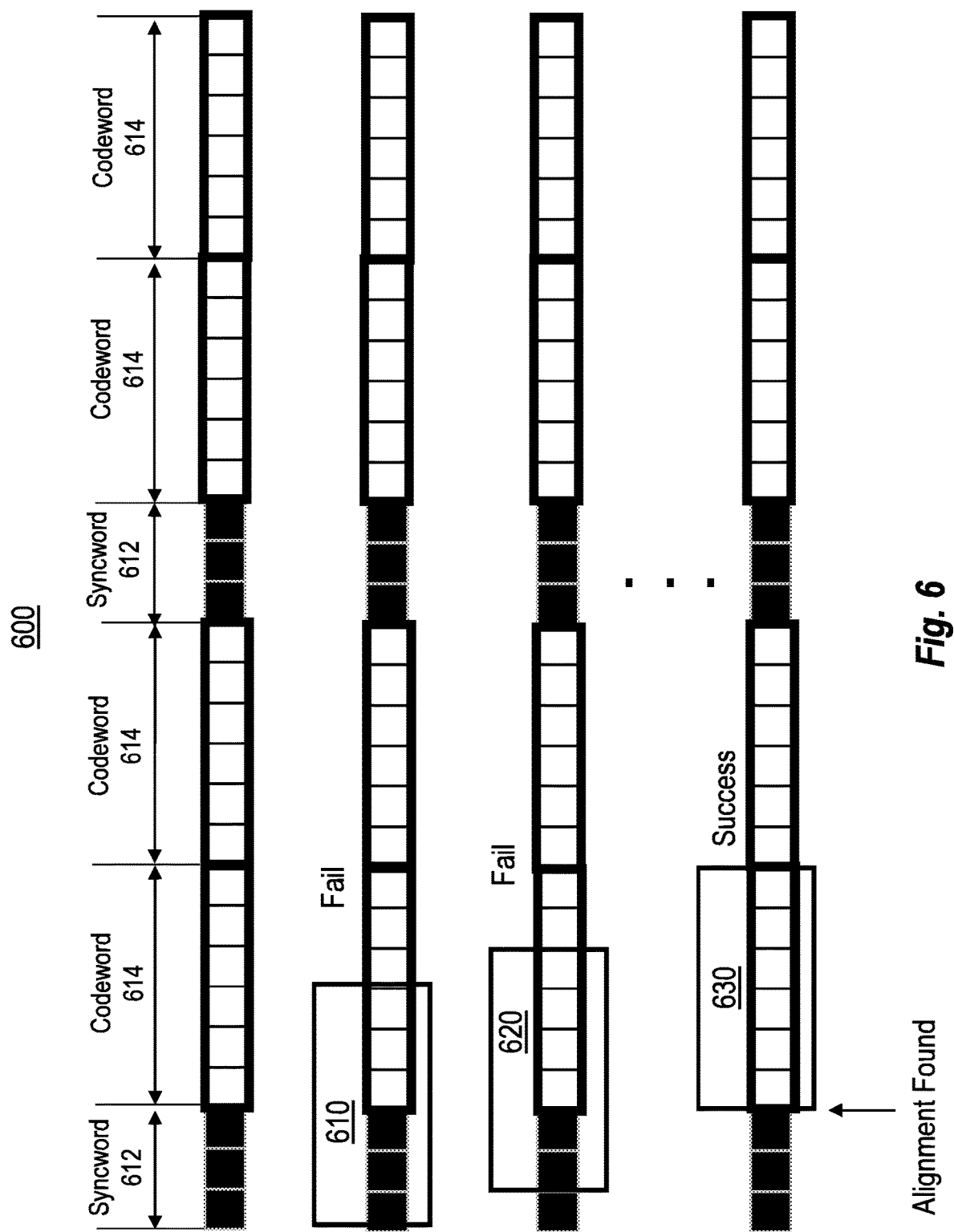
FIG. 6 illustrates an example of a process of finding an alignment of a code block in a data stream.

Unlike conventional receivers, in the receiver 360, while the synchronizer 368 is trying to achieve synchronization, the FEC decoder 370 is also trying to find an alignment of a code block. FIG. 6 illustrates a process of identifying alignment in a data stream 600 (such as a bit stream). The data stream 600 includes multiple syncwords 612 and multiple codewords 614.

As illustrated, a first data window 610 of a predetermined number of data units (such as symbols or bits) is selected. The decoder assumes the first data window 610 to be a codeword. The alignment detector 372 attempts to decode the first data window 610 to determine whether the first data window 610 is a valid codeword. If the alignment detector 372 is unable to decode the first data window 610, the first data window 610 is not a valid codeword, a second data window 620 is selected. Similarly, the decoder assumes the second data window 620 to be a codeword. The alignment detector 372 attempts to decode the second data window 620 to determine whether the second data window 620 is a valid codeword. If the second data window 620 is not a valid codeword, a third data window 630 is selected. This process repeats until the alignment detector 372 is able to decode a window so as to identify a data window that is a valid codeword. Once a valid codeword is identified, an alignment is established. Once an alignment has been established with some predetermined confidence, the decoder need only decode the actual received codewords as identified by the alignment.

Referring back to FIG. 3, if the synchronizer 368 achieves synchronization before the FEC decoder 370 finds an alignment of a code block, the synchronizer is configured to cause the FEC decoder 370 to switch to the lock mode. In response to switching to lock mode, the FEC decoder 370 stops its attempts of finding codewords and starts to decode based on the alignment found by the synchronizer 368. On the other hand, if the synchronizer 368 detects the one or more syncwords after the FEC decoder 370 finds an alignment, the synchronizer 368 notifies the FEC decoder 370 of the detected syncwords, causing the FEC decoder 370 to skip the syncwords in subsequent decoding of codewords while keeping the previously decoded codewords. Since the FEC decoder 370 is able to keep the decoded codewords prior to the acquisition of the synchronizer 368, the receiver 360 could establish communication sooner than the acquisition of the synchronizer 368. In particular, the embodiments described herein are well suited to non-interleaved waveforms where the receiver is capable of FEC decoding at a much higher rate than the low-rate waveform of interest.

In some embodiments, such an FEC decoder may also be used to decode symbol streams in sync-less waveforms. Alternatively or in addition, the FEC decoder may be used to accelerate the acquisition of a synchronized waveform by a synchronizer. If an alignment is found before the acquisition is completed by the synchronizer, the decoder continues to decode based on the identified alignment. Once the acquisition is completed by the synchronizer, the decoder can keep the decoded codewords, and then continue to decode, skipping the syncwords identified by the synchronizer.

While FIG. 6 illustrates an example of a sliding window that progressively moves bit by bit to select various possible alignments, it should be appreciated that various alternatives may be implemented in various different embodiments. For example, as illustrated above, a sliding window that progressively moves symbol by symbol to select alignments may be implemented. Alternatively, a sliding window that moves multiples of bits or symbols may be used to select alignments. Alternatively or additionally, a random or pseudo randomly selected window alignment may be used. Various selection techniques will be discussed in more detail below.

As illustrated in the preceding examples, at low enough data rates, a sliding window attempting every possible alignment for decoding until a valid alignment can be found can be performed for every single received bit. This example is covered extensively above, and as such, will not be treated further here.

As the data rate increases, the decoder may not be able to process fast enough to attempt decoding on every possible FEC block alignment. In such cases, some subset of the possible alignments may be performed. For example, in some embodiments, the sliding window may slide multiple bits for each attempt to decode a possible FEC block alignment. In these cases, care should be taken that the alignment will be eventually found. That is, care should be taken not to cause the window to slide in a fashion that there is a possibility that an alignment will never be found. For example, consider a trivial case where there are 6 bits per codeword and the window slides 3 bit per shift. In this case, if a codeword is not found on the first attempt, the 3-bit shift will assure that the codeword will never be found. Using a 2-bit shift, only half of the possible first alignments will result in eventually finding a correct alignment, while the other half of possible first alignments will result in never finding a valid alignment. For example, for a code block having a size of 1024 bits, the window shift size of 3 bits will ensure that the alignment will be found within 3 code blocks. For instance, when a window shift size is three bits, a first window, starting at a first data point, is selected. If an attempt of decoding the first window does not identify a valid codeword, a second window, starting at a second data point, is selected. The second data point is 3 bits away from the first data point. If the attempt of decoding the second data window also does not identify a valid code word, a third window starting at a third data point (that is 3 bits away from the second data point) is selected. This process repeats until a valid codeword is identified, and it is certain that within 1024 attempts (i.e., within 3 code blocks), a valid codeword should be identified. Note, the window shift size is not the same as the window size. Each of the first window, the second window, and the third window has a same size as the code block (i.e., 1024 bits). To ensure that when using multi-bit shifting, an alignment will eventually be found, the window shift size is selected to be a relatively prime number with respect to the size of the codeword or code block.

Similar principles may be applied with respect to aligning on symbols with modulation orders greater than 1. For example, systems can transmit symbols that represent multiple bits, such as when symbols are modulated using quadrature phase shift keying (QPSK) (4 coded bits per symbol) or binary phase shift keying (BPSK) (2 coded bits per symbol). Embodiments can use a sliding window where every symbol alignment is attempted until a valid alignment is discovered, or where multiple symbol shifts are used. The same principles described above should be taken into account in such situations.

Note that when symbols are used instead of bits, phase ambiguities can occur, such that these ambiguities must be accounted for in the alignment algorithm. For example, for BPSK, an ambiguity may exist as to whether a sequence is 11001110 . . . or 00110001 . . . . For QPSK there are 4 different possible ambiguities for each symbol. Thus, some embodiments may include attempting every possible symbol phase alignment until a valid alignment is found.

Note that as indicated above, in some embodiments, the window shift size may be a random or pseudo randomly selected size.

As discussed above, embodiments may perform a full or partial decoding of a given window. Full decoding occurs when a codeword is able to be correctly identified by the decoding process within some predetermined criteria. For example, such criteria may be related to a number of iterations performed by an FEC decoder. That is, a codeword will begin to converge over iterations if the alignment is correct. If the alignment is not correct, the codeword will not converge. Thus, embodiments may specify a maximum number of iterations before decoding is abandoned. Thus, partial decoding occurs when decoding is abandoned and a determination is made that a valid codeword will not be found, and that a valid alignment has not been selected. In some embodiments, the number of iterations to perform until decoding is abandoned is determined based on the capabilities of the decoding hardware relative to a data rate. Thus, for example, if hardware is capable of performing at 100 Mbps and the data rate is 100 Kbps, this implies that the hardware is three orders of magnitude more capable than needed. In this case, 10s or even hundreds of iterations can be performed before abandoning decoding. Alternatively, if the hardware and data rates are closer together, the number of iterations may be drastically reduced. Indeed, in many embodiments, a determination can be made as to whether or not a decoding will converge within 10 iterations.

Alternatively or additionally, the criteria of whether or not to abandon decoding may be based on determination of Hamming distances between the results of subsequent iterations. If these distances exceed some predetermined threshold, then attempts to decode can be abandoned, and only a partial decoding is performed.

Alternatively or additionally, the criteria of whether or not to abandon decoding may be based on the number of bits flipped during one or more decoding operations.

The same principles could be used in waveforms that use different FEC schemes. For example, the embodiments described herein are well suited to non-interleaved waveforms where the receiver is capable of Turbo decoding at a much higher rate than the low-rate waveform of interest. As another example, full low-density parity-check (LDPC) decoding or partial LDPC decoding could also be used where the number of satisfied checks is the metric. In this case, even a single hardware iteration may be sufficient to identify the number of satisfied checks there are. Similarly, the same principles could also be used in other schemes such as algebraic codes with errors-corrected metrics.

In many cases, the receiver may find FEC alignment faster than alternative methods but it has an added benefit of having already fully decoded a block (or partial decoding a block) by the time the synchronization is achieved. In other words, if the decoder finishes decoding a valid codeword, sync lock can be declared, and immediately the previously received and currently decoded codeword is available at the decoder. Accordingly, the principles described herein could make possible lower overhead sync-less waveforms. If it is used on waveforms with sync sequences, sync detector hardware would still be required to identify when a sync sequence was present so an appropriate window shift can be applied to the window that selects the FEC block and sends it to the decoder.

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Figure 7:
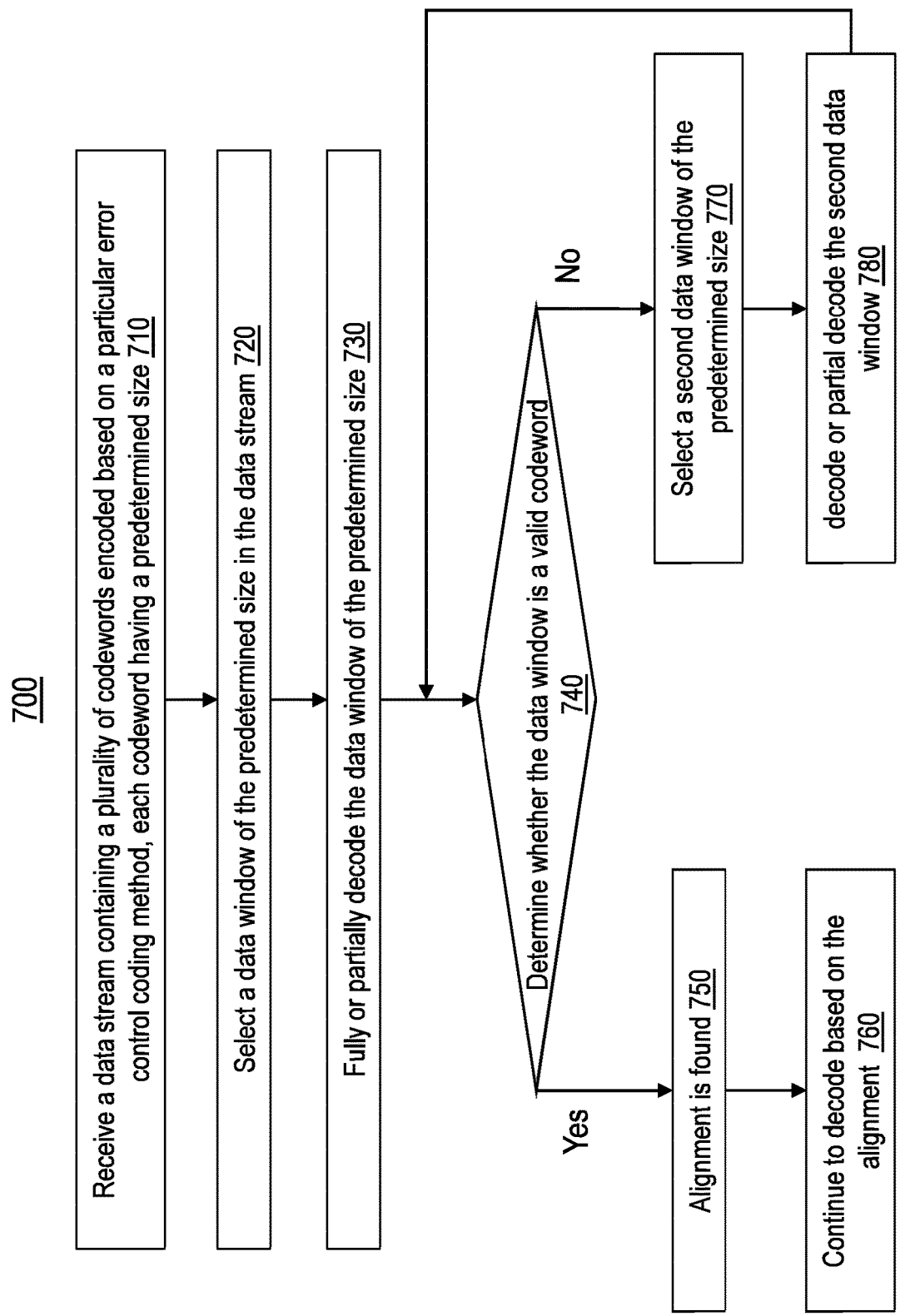
FIG. 7 illustrates a flowchart of an example of a method for finding an alignment of a code block by an FEC decoder in a data stream.

FIG. 7 illustrates a flowchart of an example method 700 for detecting an alignment of a code block in a data stream. The method 700 may be performed by a FEC decoder 370 and/or receiver 360 of FIG. 3 or 8 for decoding sync-less waveforms or waveforms with sync sequences. The method 700 includes receiving a data stream containing a plurality of codewords encoded based on a particular error control coding method (act 710). Each codeword has a predetermined size. The particular error control coding method may be (but are not limited to) a turbo coding method, or an LDPC method. The method 700 further includes selecting a data window of the predetermined size (which is the size of each codeword) (act 720) and fully decoding or partially decoding the data window of the predetermined size (act 730). It is then determined whether the data window is a valid codeword based on the decoding result (act 740). In response to determining that the data window is a valid codeword, an alignment is found (act 750), and the decoder continues to decode a next code block based on the alignment (act 760). On the other hand, in response to determining that the data window is not a valid codeword, a second data window of the predetermined size is selected (act 770), and the second data window is fully decoded or partially decoded (act 780). Based on the decoding result, it is then determined whether the second data window is a valid codeword (act 740). This process repeats until an alignment of a code block is found (act 750).

In some embodiments, the method 700 may be implemented to find alignment in a sync-less waveform. Alternatively, the method 700 may be implemented to help a synchronizer to accelerate the process of acquisition for a waveform with sync sequences.

Figure 8:
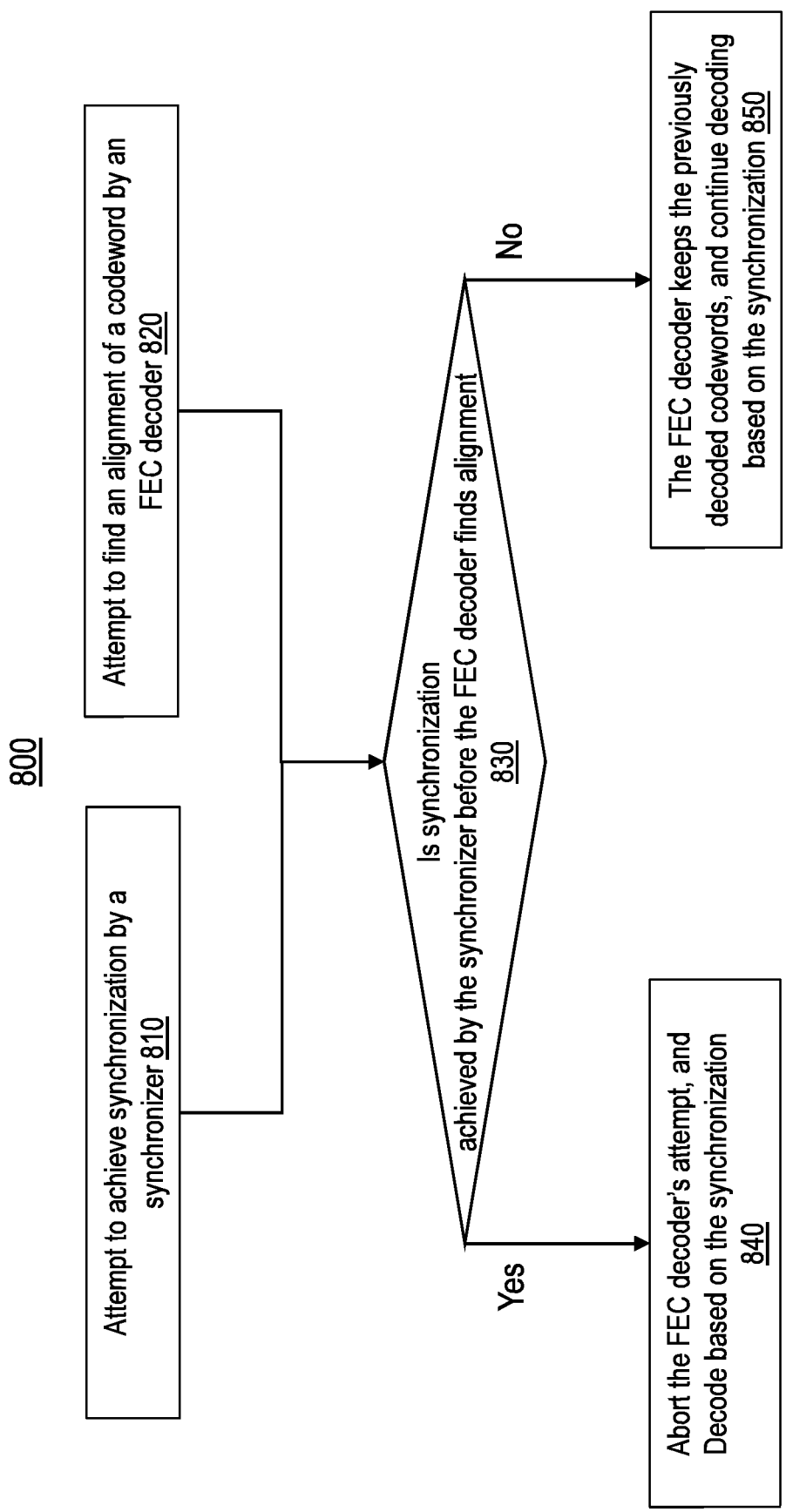
FIG. 8 illustrates a flowchart of an example of a method for accelerating a synchronizer's acquisition of a data stream by simultaneously finding an alignment of a code block of the data stream by an FEC decoder.

FIG. 8 illustrates a flowchart of an example of method 800 for using an FEC decoder to accelerate synchronization for waveforms with sync sequence (i.e., syncwords). The method 800 may be performed by the receiver 360 of FIG. 3. The method 800 includes attempting to achieve synchronization by a synchronizer (act 810). The synchronizer corresponds to the synchronizer 368 of FIG. 3. While the synchronizer attempts to achieve synchronization, an FEC decoder (which corresponds to the FEC decoder 370 of FIG. 3) is attempting to find an alignment of a code block (act 820). The act 820 of attempting to find an alignment of a code block by the FEC decoder corresponds to the method 700 of FIG. 7. If the synchronization is achieved by the synchronizer before the FEC decoder finds an alignment of a code block (act 830, Yes), the FEC decoder aborts its attempt of finding an alignment of a code block and starts to decode based on the synchronization (act 840). If the FEC decoder finds an alignment of a code block before the synchronization is achieved by the synchronizer (act 830, No), the FEC decoder keeps the previously decoded codewords, and continue decoding based on the synchronization, skipping the syncwords identified by the synchronization (act 850).

For the processes and methods disclosed herein, the operations performed in the processes and methods may be implemented in differing order. Furthermore, the outlined operations are only provided as examples, and some of the operations may be optional, combined into fewer steps and operations, supplemented with further operations, or expanded into additional operations without detracting from the essence of the disclosed embodiments.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A digital communication system comprising:
a receiver configured to receive a data stream containing a plurality of codewords, each codeword having a predetermined size and having been encoded based on a particular error control coding method, wherein
the receiver includes a forward error correction (FEC) decoder having an acquisition mode and a lock mode;
the FEC decoder is configured to find an alignment of a code block by attempting to decode one or more data windows of the predetermined size in the data stream, comprising:
selecting a first data point in the data stream;
attempting to decode a first data window of the predetermined size starting from the first data point based on the particular error control coding method;
determining whether a valid codeword can be identified by attempting to decode the first data window;
in response to determining that a valid codeword can be identified by attempting to decode the first data window, determining that an alignment of the code block is found; and switching the FEC decoder to the lock mode;

in response to determining that a valid codeword is not identified by attempting to decode the first data window, selecting a second data point in the data stream; and attempting to decode a second data window of the predetermined size starting from the second data point based on the particular error control coding method.

2. The digital communication system of claim 1, wherein the second data point is a predetermined number of data units away from the first data point.

3. The digital communication system of claim 2, wherein:
the predetermined number of data units is determined based on a data receiving rate of the data stream; and
when the data receiving rate is a rate that is higher than a lower rate, the second data point is further apart from the first data point than that when the data receiving rate is the lower rate.

4. The digital communication system of claim 2, wherein the predetermined number is a prime number relative to a number of data units contained in each codeword.

5. The digital communication system of claim 2, wherein:
the first data point comprises a first symbol; and
the second data point comprises a second symbol that is a predetermined number of symbols away from the first symbol in the data stream.

6. The digital communication system of claim 1, wherein:
the first data point comprises a first bit; and
the second data point comprises a second bit that is a predetermined number of bits away from the first bit in the data stream.

7. The digital communication system of claim 1, wherein:
the data stream is divided into a plurality of frames;
each frame starts or ends with a syncword; and
the receiver further includes a synchronizer configured to detect one or more syncwords in the data stream.

8. The digital communication system of claim 7, wherein when the synchronizer detects the one or more syncwords before the FEC decoder finds an alignment of a code block, the synchronizer is configured to cause the FEC decoder to switch to the lock mode.

9. The digital communication system of claim 7, wherein when the synchronizer detects the one or more syncwords after the FEC decoder finds an alignment, the synchronizer notifies the FEC decoder of positions of syncwords, causing the FEC decoder to skip the syncwords in subsequent decoding of codewords while keeping previously decoded codewords.

10. The digital communication system of claim 1, wherein partial decoding includes performing an error correction process iteratively until a decoder metric reaches a predetermined value.

11. The digital communication system of claim 10, wherein the decoder metric includes (1) a predetermined number of iterations being performed, (2) a predetermined number of bits being corrected, (3) numerical convergence or divergence of internal decoding metrics, or (4) an error is detected.

12. The digital communication system of claim 10, wherein the predetermined value of a decoder metric is determined based on processing power of the FEC decoder relative to data receiving rate of the data stream.

13. The digital communication system of claim 1, the particular error control coding method is one of: (1) a turbo coding method, or (2) a low-density parity-check decoding method.

14. A method for finding an alignment of a code block by attempting to fully decode or partially decode one or more data windows in a data stream, wherein the data stream includes a plurality of codewords encoded based on a particular error control coding method, and each codeword has a predetermined size, the method comprising:

selecting a first data point in the data stream;

attempting to decode by a forward error correction (FEC) decoder a first data window of the predetermined size starting from the first data point based on the particular error control coding method;

determining whether a valid codeword can be identified by attempting to decode the first data window; and in response to determining that a valid codeword can be identified by attempting to decode the first data window, determining that an alignment of the codeword with the first data window is found; and continuing decoding subsequent codewords based on the alignment;

in response to determining that a valid codeword is not identified by attempting to decode the first data window, selecting a second data point in the data stream; and attempting to decode a second data window starting from the second data point based on the particular error control coding method.

15. The method of claim 14, wherein the second data point is a predetermined number of data units away from the first data point, the data unit is a symbol or a bit.

16. The method of claim 15, wherein:
the predetermined number of data units is determined based on a data receiving rate of the data stream; and
when the data receiving rate is a rate that is higher than a lower rate, the second data point is further apart from the first data point than that when the data receiving rate is the lower rate.

17. The method of claim 14, wherein:
the data stream is divided into a plurality of frames;
each frame starts or ends with a syncword;
the method further includes detecting one or more syncwords in the data stream.

18. The method of claim 17, wherein the method further includes:
in response to detecting the one or more syncwords before the FEC decoder finds an alignment of a code block, causing the FEC decoder to switch to a lock mode; or
in response to detecting the one or more syncwords after the FEC decoder finds an alignment, notifying the FEC decoder of positions of syncwords, causing the FEC decoder to skip the syncwords in subsequent decoding of codewords while keeping previously decoded codewords.

19. The method of claim 14, wherein partial decoding includes performing an error correction process iteratively until a decoder metric reaches a predetermined value.

20. A forward error correction (FEC) decoder having an acquisition mode and a lock mode, wherein:
when the FEC decoder is in the lock mode, the decoder knows borders of each codeword in a data stream, and the decoder is configured to decode each codeword in the data stream based on a particular error control coding method;

when the FEC decoder is in the acquisition mode, the FEC decoder does not know the borders of each codeword in the data stream, and the FEC decoder is configured to:

find an alignment of a code block in the data stream by attempting to fully decode or partially decode one or more data windows of a predetermined size in the data stream, the predetermined size being a size of each codeword, comprising:

selecting a first data point in the data stream;

attempting to decode a first data window of the predetermined size starting from the first data point based on the particular error control coding method;

determining whether a valid codeword can be identified by attempting to decode the first data window;

in response to determining that a valid codeword can be identified by attempting to decode the first data window, determining that an alignment of the code block is found; and switching the FEC decoder to the lock mode;

in response to determining that the decoded data window is not a valid codeword, selecting a second data point in the data stream; and attempting to decode a second data window of the predetermined size starting from the second data point based on the particular error control coding method.

\* \* \* \* \*